(12) United States Patent
Suzuki et al.

(10) Patent No.: US 12,372,840 B2
(45) Date of Patent: Jul. 29, 2025

(54) LIQUID CRYSTAL DISPLAY DEVICE

(71) Applicant: Japan Display Inc., Tokyo (JP)

(72) Inventors: Takayuki Suzuki, Tokyo (JP);
Hiroyuki Abe, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/414,623

(22) Filed: Jan. 17, 2024

(65) Prior Publication Data

US 2024/0152011 A1 May 9, 2024

Related U.S. Application Data

(63) Continuation of application No. 17/971,744, filed on Oct. 24, 2022, now Pat. No. 11,914,256, which is a
(Continued)

(30) Foreign Application Priority Data

Oct. 30, 2015 (JP) ................................. 2015-214375

(51) Int. Cl.
*G02F 1/1362* (2006.01)
*G02F 1/133* (2006.01)
(Continued)

(52) U.S. Cl.
CPC .... *G02F 1/136286* (2013.01); *G02F 1/13306* (2013.01); *G02F 1/133345* (2013.01); *G02F 1/1345* (2013.01); *G02F 1/1368* (2013.01); *G09G 3/3688* (2013.01); *H10D 86/421* (2025.01); *H10D 86/441* (2025.01); *H10D 86/60* (2025.01); *G02F 1/133512* (2013.01);
(Continued)

(58) Field of Classification Search
CPC ......... H10K 50/822; G09G 2300/0426; G09G 3/3266; G09G 3/3275
See application file for complete search history.

(56) References Cited

U.S. PATENT DOCUMENTS 8,638,280 B2 * 1/2014 Nonaka ................... G11C 19/28
345/87
10,248,238 B2 * 4/2019 Abe ....................... G06F 3/0446
(Continued)

FOREIGN PATENT DOCUMENTS

CN 103424901 A * 12/2013 ......... G02F 1/13306
CN 111338138 A * 6/2020 ........... G02F 1/1339
(Continued)

*Primary Examiner* — Edward Chin
(74) *Attorney, Agent, or Firm* — Michael Best & Friedrich LLP

(57) ABSTRACT

A liquid crystal display device having an outer shape of a display region formed other than a rectangle. A driver for supplying a video signal is disposed outside the display region. A selector with selector TFT is disposed between the display region and the driver. A video signal line is disposed between the driver and the selector, and a drain line is disposed between the selector and the display region. A scanning circuit for supplying a scanning signal to the scanning line is disposed outside the display region. The selector is disposed between the scanning line and the display region, and covered with ITO as the common electrode. The common bus wiring is disposed outside the selector.

8 Claims, 8 Drawing Sheets

Related U.S. Application Data continuation of application No. 17/185,124, filed on Feb. 25, 2021, now Pat. No. 11,506,949, which is a continuation of application No. 16/782,223, filed on Feb. 5, 2020, now Pat. No. 10,969,641, which is a continuation of application No. 16/365,917, filed on Mar. 27, 2019, now Pat. No. 10,591,794, which is a continuation of application No. 16/058,253, filed on Aug. 8, 2018, now Pat. No. 10,281,787, which is a continuation of application No. 15/284,639, filed on Oct. 4, 2016, now Pat. No. 10,114,260.

(51) Int. Cl.
*G02F 1/1333* (2006.01)
*G02F 1/1335* (2006.01)
*G02F 1/1337* (2006.01)
*G02F 1/1343* (2006.01)
*G02F 1/1345* (2006.01)
*G02F 1/1368* (2006.01)
*G09G 3/36* (2006.01)
*H10D 86/40* (2025.01)
*H10D 86/60* (2025.01)

(52) U.S. Cl.
CPC .. *G02F 1/133514* (2013.01); *G02F 1/133519* (2021.01); *G02F 1/13378* (2013.01); *G02F 1/134363* (2013.01); *G02F 1/13439* (2013.01); *G02F 1/136295* (2021.01); *G02F 2201/121* (2013.01); *G02F 2201/123* (2013.01); *G02F 2201/56* (2013.01); *G02F 2203/04* (2013.01); *G09G 2300/0426* (2013.01); *G09G 2310/0297* (2013.01)

(56) References Cited

U.S. PATENT DOCUMENTS

| | | | | |
|---|---|---|---|---|
| 10,490,620 | B1* | 11/2019 | Lai | G02F 1/136286 |
| 2008/0204648 | A1* | 8/2008 | Tanaka | G02F 1/136213 349/138 |
| 2008/0266210 | A1* | 10/2008 | Nonaka | G09G 3/20 345/55 |
| 2009/0102758 | A1* | 4/2009 | Anzai | G09G 3/3266 345/76 |
| 2016/0217740 | A1* | 7/2016 | Lee | G09G 3/3258 |
| 2016/0232837 | A1* | 8/2016 | Lee | G09G 3/3275 |
| 2016/0240157 | A1* | 8/2016 | Aoki | G09G 3/3666 |
| 2016/0247478 | A1* | 8/2016 | Ishige | G09G 3/3677 |
| 2017/0178583 | A1* | 6/2017 | Zhang | G09G 3/3677 |
| 2017/0294502 | A1* | 10/2017 | Ka | H10K 59/131 |
| 2017/0309644 | A1* | 10/2017 | Yeh | H10K 59/131 |
| 2017/0322446 | A1* | 11/2017 | Tae | G02F 1/134309 |
| 2018/0107084 | A1* | 4/2018 | Hirata | G02F 1/1345 |
| 2018/0259802 | A1* | 9/2018 | Koide | G02F 1/13454 |
| 2018/0322837 | A1* | 11/2018 | Sakurai | G02F 1/13452 |
| 2019/0171323 | A1* | 6/2019 | Abe | G06F 3/0412 |
| 2020/0301220 | A1* | 9/2020 | Ina | H10D 86/441 |
| 2021/0181591 | A1* | 6/2021 | Suzuki | H10D 86/60 |
| 2022/0100044 | A1* | 3/2022 | Zhang | G02F 1/1345 |

FOREIGN PATENT DOCUMENTS

| | | | | |
|---|---|---|---|---|
| CN | 113937109 | A * | 1/2022 | ....... G02F 1/136286 |
| CN | 217157253 | U * | 8/2022 | |
| JP | 2009134246 | A * | 6/2009 | ........... G09G 3/2096 |
| JP | 2016148751 | A * | 8/2016 | ........... G02F 1/1345 |

\* cited by examiner

LIQUID CRYSTAL DISPLAY DEVICE

CROSS-REFERENCE TO RELATED APPLICATIONS

This application is a continuation of U.S. application Ser. No. 17/971,744 filed on Oct. 24, 2022, which, in turn, is a continuation of U.S. application Ser. No. 17/185,124 (now U.S. patent application Ser. No. 11/506,949) filed on Feb. 25, 2021, which, in turn, is a continuation of U.S. application Ser. No. 16/782,223 (now U.S. patent application Ser. No. 10/969,641) filed on Feb. 5, 2020, which, in turn, is a continuation of U.S. application Ser. No. 16/365,917 (now U.S. Pat. No. 10,591,794) filed on Mar. 27, 2019, which, in turn, is a continuation of U.S. application Ser. No. 16/058,253 (now U.S. Pat. No. 10,281,787) filed on Aug. 8, 2018, which, in turn, is a continuation of U.S. application Ser. No. 15/284,639 (now U.S. Pat. No. 10,114,260) filed on Oct. 4, 2016. Further, this application claims priority from Japanese Patent Application JP 2015-214375 filed on Oct. 30, 2015, the entire contents of which are hereby incorporated by reference into this application.

BACKGROUND

The present invention relates to a display device, and more particularly, to the display device having a display region and an outer shape configured into the shape other than a rectangle.

The liquid crystal display device as one of the display devices includes a TFT substrate having pixels including pixel electrodes and thin film transistors (TFT) arrayed in a matrix, a counter substrate which faces the TFT substrate, and a liquid crystal interposed between the TFT substrate and the counter substrate. An image is famed by controlling the luminous transmittance of liquid crystal molecules for each pixel. The use of the flat and light-weight liquid crystal display device has been extended in various fields.

In most cases, the liquid crystal display device has the display region or the outer shape formed into a rectangle. However, the display device used for the automobile or various types of game machines may be required to have the display region or the outer shape formed into the shape other than a rectangle. Japanese Unexamined Patent Application Publication No. 2008-292995 discloses the problem of the scanning line driving circuit, which occurs owing to the shape of the display device other than a rectangle, and countermeasure to be taken for coping with the problem.

SUMMARY

In the case where the display region is shaped other than a rectangle, layouts of the peripheral circuits and wirings which are arranged around the display device will be different from the layout of those on the rectangular display region. The display device shaped other than a rectangle may cause the problem that will be hardly caused by the rectangular display region. The display region shaped other than a rectangle will be referred to as a "variant-shape display region", and the display panel having the display region shaped other than a rectangle will be referred to as a "variant-shape display panel" hereinafter.

The variant-shape display panel may be mostly demanded to exhibit high resolution. The high resolution may require more pixels in the lateral direction as well as the number of drain lines for supplying video signals to the pixels accordingly. The increase in the number of the drain lines may increase the number of the drain routing lines in the area outside the display region, which enlarges the area of the wiring region for the increased drain routing lines. Recently, the width from the end of the display region to the end of the display panel, that is, the frame region has been increasingly demanded to be reduced. It is necessary to reduce the number of drain routing lines for the purpose of reducing the frame region.

The technique for reducing the number of drain routing lines has been introduced for the purpose of preventing increase in the number of those lines. That is, the selector circuit to be described later is used for reducing the number of the video signal lines supplied from the driver IC to ½ or ⅓. Use of the selector circuit for the variant-shape display region causes interference between the selector circuit and the scanning line or between the common wiring and the selector circuit (intersection on the layout, or electrical effect owing to intersection or proximity).

It is an object of the present invention to provide the display device configured to have the display region with reduced frame area in spite of the variant-shape display panel with the variant-shape display region including the selector circuit.

Specifically, the present invention is configured as described below.

(1) The liquid crystal display device in which an outer shape of the display region is shaped other than a rectangle, which includes a TFT substrate on which scanning lines extending in a first direction are arranged along a second direction, drain lines extending in the second direction are arranged along the first direction, and pixels are formed in the regions defined by the scanning lines and the drain lines, and a counter substrate disposed to face the TFT substrate via the liquid crystal. The driver for supplying video signals is disposed outside the display region. The selector with the selector TFT is disposed between the display region and the driver. Video signal lines are disposed between the driver and the selector, and the drain lines are disposed between the selector and the display region. The relationship between the number of the drain lines corresponding to the display region, that is, Nd and the number of the video signal lines corresponding to the drain line, that is, Nv is expressed as Nd/Nv=n, where n denotes an integer equal to or larger than 2.

The scanning circuit for supplying the scanning signal to the scanning line is disposed outside the display region, and the selector is disposed between the scanning line and the display region, or between the scanning circuit and the display region. The selector is covered with the ITO as the common electrode, and the common bus wiring is disposed outside the selector.

(2) The selector control signal line for applying the gate voltage to the selector TFT is formed on the same layer on which the drain lines are famed.

DETAILED DESCRIPTION

The viewing angle is an important property for the liquid crystal display device as one of various types of display devices. The viewing angle property refers to the phenomenon which varies luminance or chromaticity in accordance with the viewing angle, for example, at which the screen is viewed from the front or the diagonal direction. The IPS (In Plane Switching) method exhibits the excellent viewing angle property, which is designed to operate the liquid crystal molecules in the horizontal electric field. In the embodiment to be described later, the explanation will be made on the assumption of using the liquid crystal display device of IPS type. The present invention is applied to the structure outside the display region. However, the cross section structure of the display region will be preliminarily described for explaining the layer structure.

Figure 1:
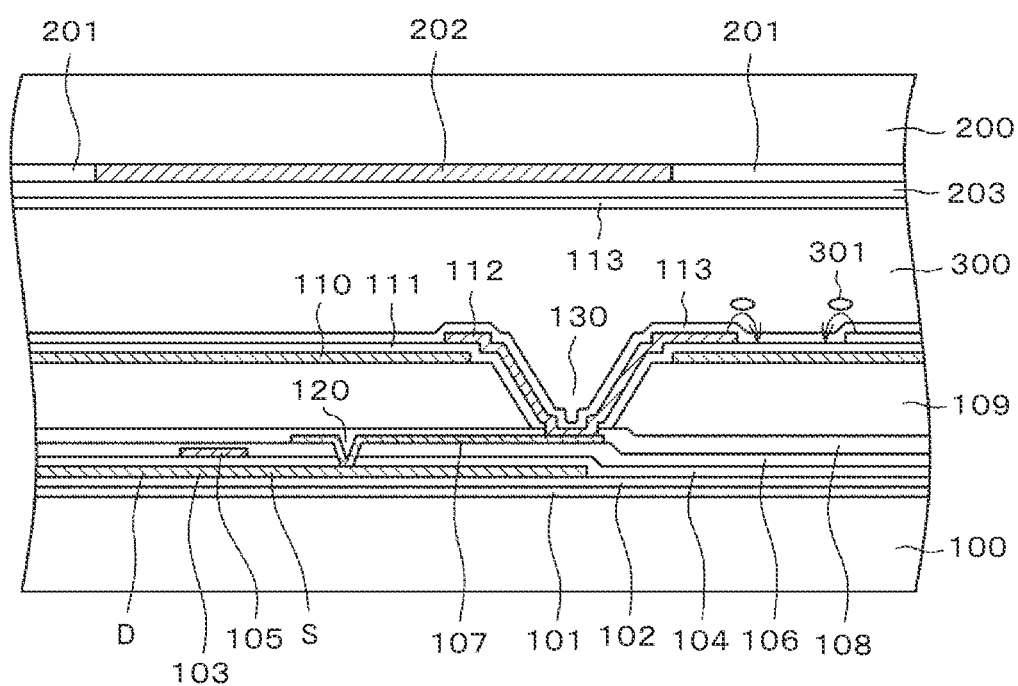
FIG. 1 is a sectional view of a display region of a liquid crystal display device.

FIG. 1 is a sectional view of the liquid crystal display device of IPS type. The TFT shown in FIG. 1 is of so called top gate type, and employs LTPS (Low Temperature Poly-Si) as the semiconductor. Referring to FIG. 1, a first base film 101 as SiN, and a second base film 102 as $SiO_2$ are applied to a glass substrate 100 through CVD (Chemical Vapor Deposition). The first base film 101 and the second base film 102 serve to prevent impurities of the glass substrate 100 from contaminating a semiconductor layer 103.

The semiconductor film 103 formed on the second base film 102 is derived from the process of forming an a-Si film on the second base film 102 through the CVD, which is then converted into a poly-Si film through laser annealing. The poly-Si film is then patterned by photolithography. The parts of the semiconductor layer 103, which are designated by D and S denote the drain part and the source part of the TFT, respectively.

A gate insulation film 104 famed on the semiconductor film 103 is in the faint of the $SiO_2$ film constituted of TEOS (tetraethoxysilane) famed through the CVD. A gate electrode 105 as the scanning line is famed on the gate insulation film. The gate electrode 105 is constituted of, for example, the MoW film. Use of Al alloy may satisfy the requirement of lessening resistance of the gate electrode 105 or the scanning line 10.

An interlayer insulation film 106 constituted of $SiO_2$ is formed while covering the gate electrode 105 so as to insulate the gate electrode 105 from a contact electrode 107. A through hole 120 is formed in the interlayer insulation film 106 and the gate insulation film 104 for the purpose of connecting the source part S of the semiconductor layer 103 to the contact electrode 107. The photolithography is conducted simultaneously for forming the through hole 120 both in the interlayer insulation film 106 and the gate insulation film 104.

The contact electrode 107 famed on the interlayer insulation film 106 is connected to a pixel electrode 112 via a through hole 130. The TFT is connected to the drain line at a not shown part.

The contact electrode 107 and the drain line are simultaneously famed on the same layer. Use of AlSi alloy for forming the contact electrode 107 and the drain line (which will be represented as the contact electrode 107) is intended to lessen resistance. As the AlSi alloy causes hillock, or diffuses Al into the other layer, the AlSi is sandwiched between barrier layers or cap layers constituted of MoW (not shown), for example.

An inorganic passivation film (insulation film) 108 serves to cover the contact electrode 107 to protect the TFT as a whole. The inorganic passivation film 108 is formed through the CVD likewise the first base film 101. An organic passivation film 109 constituted of the photosensitive acrylic resin is famed while covering the inorganic passivation film 108. Besides the acrylic resin, it is possible to use silicone resin, epoxy resin, and polyimide rein for forming the organic passivation film 109. As the organic passivation film 109 serving as the planarizing film is famed to have a large thickness in the range from 1 to 4 μm, and in most cases, approximately 2 μm.

The through hole 130 is famed in the organic passivation film 109 for conduction between the pixel electrode 112 and the contact electrode 107. An ITO (Indium Tin Oxide) is derived from sputtering, which is formed as a common electrode 110, and is patterned to remove the ITO from the through hole 130 and its periphery. The common electrode 110 may be formed into the planar shape for the respective pixels. As the common electrode is the firstly formed ITO, it may be called the first ITO.

Thereafter, the SiN to be formed as a capacitive insulation film 111 is applied to the entire surface through the CVD. The through hole is then formed in the capacitive insulation film 111 and the inorganic passivation film 108 for conduction between the contact electrode 107 and the pixel electrode 112 in the through hole 130.

Figure 6:
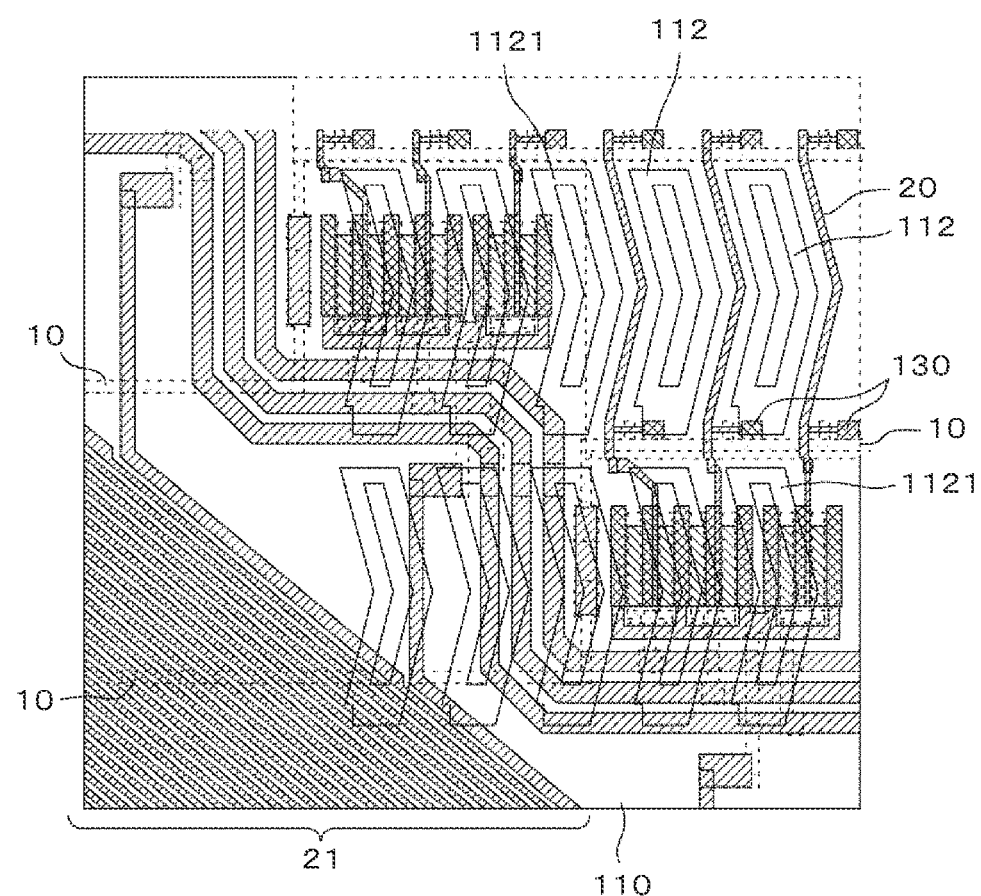
FIG. 6 is a plan view showing a layout of the peripheral part of the display region in the state where the pixel electrodes have been famed.

The ITO is famed by sputtering, and patterned to form the pixel electrode 112. As the pixel electrode is the secondly famed ITO, it may be called the second ITO. The pixel electrode has a bent stripe-like surface as shown in FIG. 6. The pixel electrode is bent so as to make the viewing angle property further uniform. The alignment film material is applied onto the pixel electrode 112 by the flexographic printing or ink jet printing, and is baked to form an alignment film 113. The alignment film 113 is subjected to the alignment process through the rubbing method or photo alignment method using the polarized UV light.

Voltage application across the pixel electrode 112 and the common electrode 110 generates the electric force line as shown in FIG. 1. A liquid crystal molecule 301 is rotated in the electric field so that the image is famed by controlling quantity of light passing through a liquid crystal layer 300 for each pixel.

Referring to FIG. 1, a counter substrate 200 is famed while interposing the liquid crystal layer 300 with the TFT substrate. A color filter 201 is famed on the inner surface of the counter substrate 200. The color filter 20 includes red, green, and blue filters for each pixel for forming a color image. A black matrix 202 is foiled between the color filters 201 for improving the image contrast. The black matrix 202 serves as the light shielding film for the TFT, preventing inflow of the photoelectric current to the TFT.

An overcoat film 203 is formed while covering the color filter 201 and the black matrix 202. Concavo-convex surfaces of the color filter 201 and the black matrix 202 may be planarized by the overcoat film 203. The alignment film 113 is formed on the overcoat film for determining the initial alignment of the liquid crystal. Likewise the alignment film 113 at the side of the TFT substrate 100, the rubbing method or the photo alignment method is employed for the alignment process of the alignment film 113.

As the above-described structure is a mere example, there may be the case that the inorganic passivation film 108 is not famed for the TFT substrate 100 depending on the structure type. The process for forming the through hole 130 may also differ depending on the structure type. The present invention will be described in detail referring to the embodiment as follows.

First Embodiment

Figure 2:
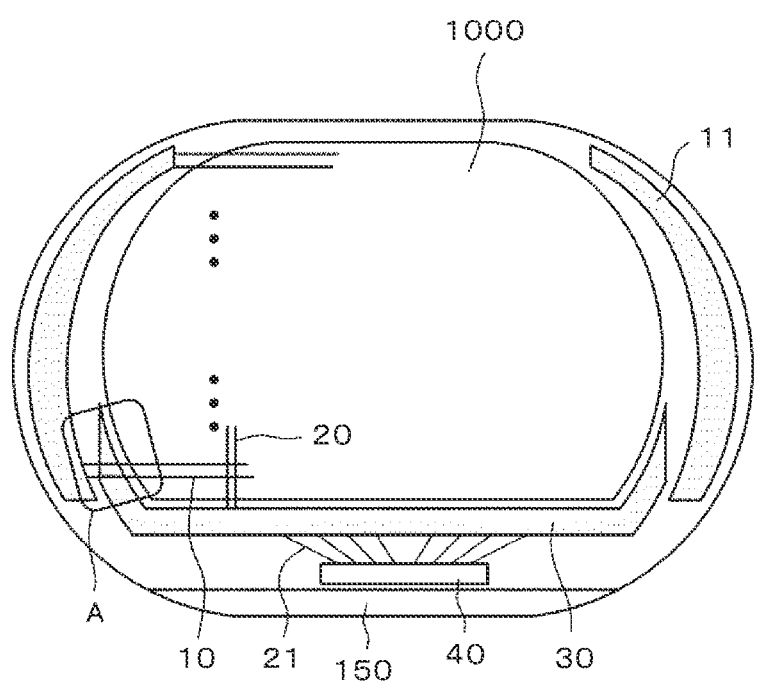
FIG. 2 is a view showing an example of a variant-shape display panel.

FIG. 2 shows an example of the variant-shape display panel having both a display region 1000 and an outer shape formed into a racetrack shape, specifically, having upper and lower linear sides, and left and right curved sides. FIG. 2 is a plan view of the panel at the TFT substrate side. Referring to FIG. 2, the display region 1000 includes laterally extending scanning lines 10, and longitudinally extending drain lines 20. The pixel is famed in each region defined by the scanning lines 10 and the drain lines 20.

As FIG. 2 shows, a selector 30 and a driver IC 40 are disposed below the display region 1000. A terminal region 150 is famed outside the driver IC 40 for connection to a flexible wiring substrate. A video signal is supplied from the driver IC 40 to the drain lines 20 on the display region 1000 via the selector 30. The number of the drain lines 20 corresponds to the number of pixels on the display region 1000 in the lateral direction. The number of video signal lead-out lines 21 from the driver IC 40 to the selector 30 may be ⅓ of the number of the drain lines, for example. The relationship between the number of the drain lines Nd and the number of the video signal lead-out lines Nv is expressed as Nd/Nv=n, where n denotes an integer equal to or larger than 2.

Scanning circuits 11 for supplying scanning signals to the scanning lines 10 are disposed at both sides of the display region 1000. As FIG. 2 shows, the selector 30 is disposed adjacent to the display region 1000. As the display region 1000 has the racetrack shape, the selector 30 partially exists between the scanning circuit 11 and the display region 1000 in a region A outside the curved side of the display region 1000. In this case, wiring interference occurs between the scanning line 10 and the selector 30.

Figure 9:
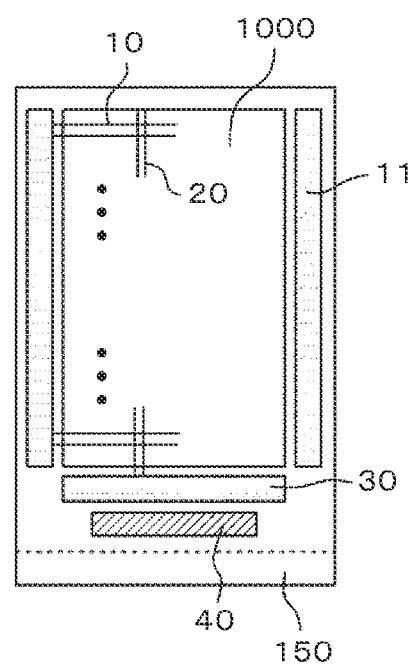
FIG. 9 is a plan view showing a layout of the rectangular display region.

FIG. 9 is a plan view of the display device having the rectangular display region 1000. Referring to FIG. 9, the selector 30, the driver IC 40, and the terminal part 150 are sequentially arranged below the display region 1000. The scan circuits 11 are disposed at both sides of the display region 1000. In this case, there is no interference between the scanning lines 10 extending from the scanning circuit 11, and the selector 30.

Figure 3:
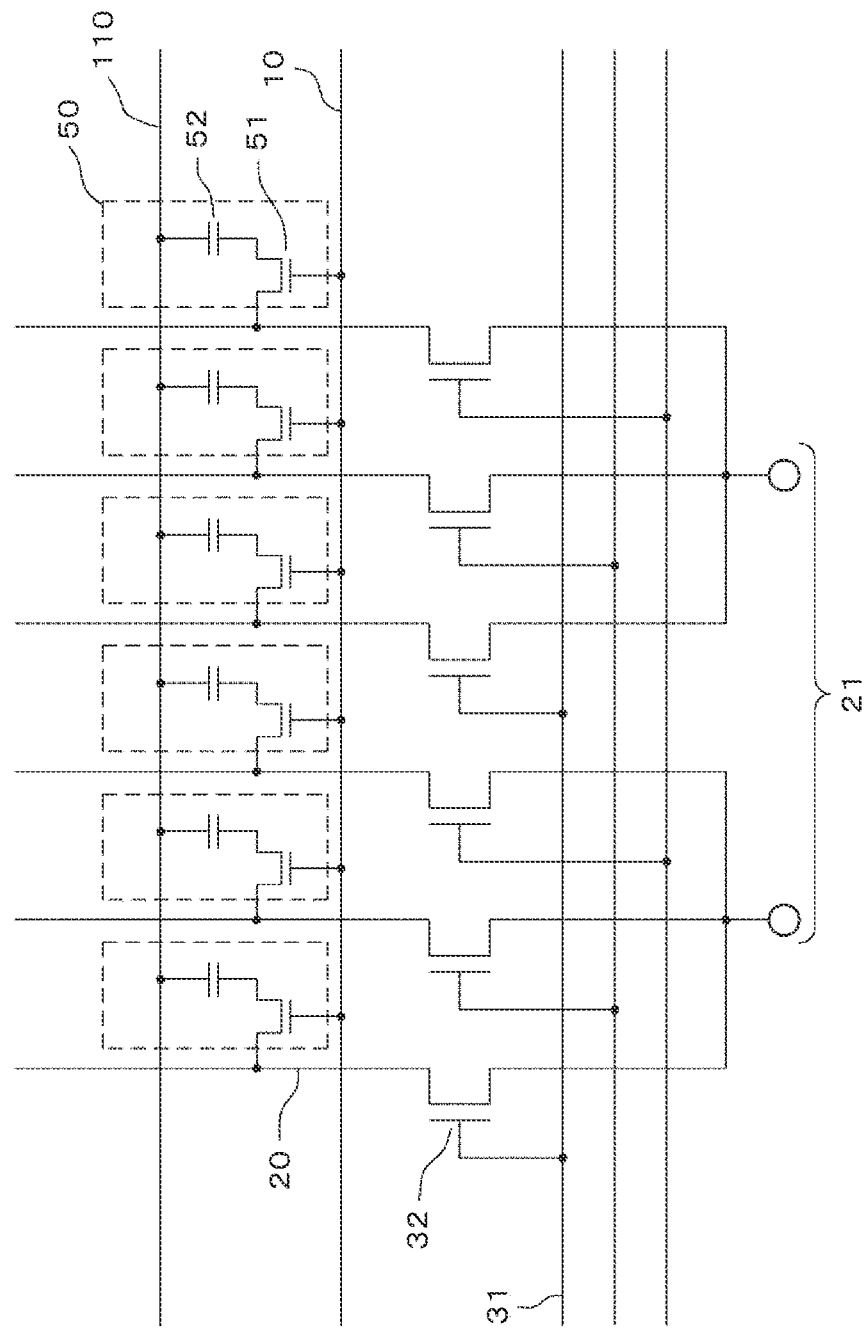
FIG. 3 is a view showing an equivalent circuit representing the selector structure.

The variant-shape display panel according to the present invention is configured to prevent interference between the scanning line 10 and the selector 30, and reduce the frame region. FIG. 3 is a view of the equivalent circuit indicating the structure of the selector 30, the upper side of which corresponds to the display region, and the lower side of which corresponds to the driver IC. Referring to FIG. 3, pixels 50 each having the TFT 51 and the pixel capacitor 52 are laterally arranged. The video signals are supplied to the respective pixels 50 via the drain lines 20. The TFTs 51 of the respective pixels 50 are controlled by the scanning lines 10.

The selector 30 is disposed adjacent to the outermost part of the display region to reduce the number of the drain lead-out lines (video signal lead-out lines) 21 outside the display region. The selector as shown in FIG. 3 reduces the number of the video signal lead-out lines 21 output from the driver IC to ⅓ of the number of the drain lines 20. It is therefore possible to save the area for routing wiring of the video signal lead-out lines 21.

Figure 4:
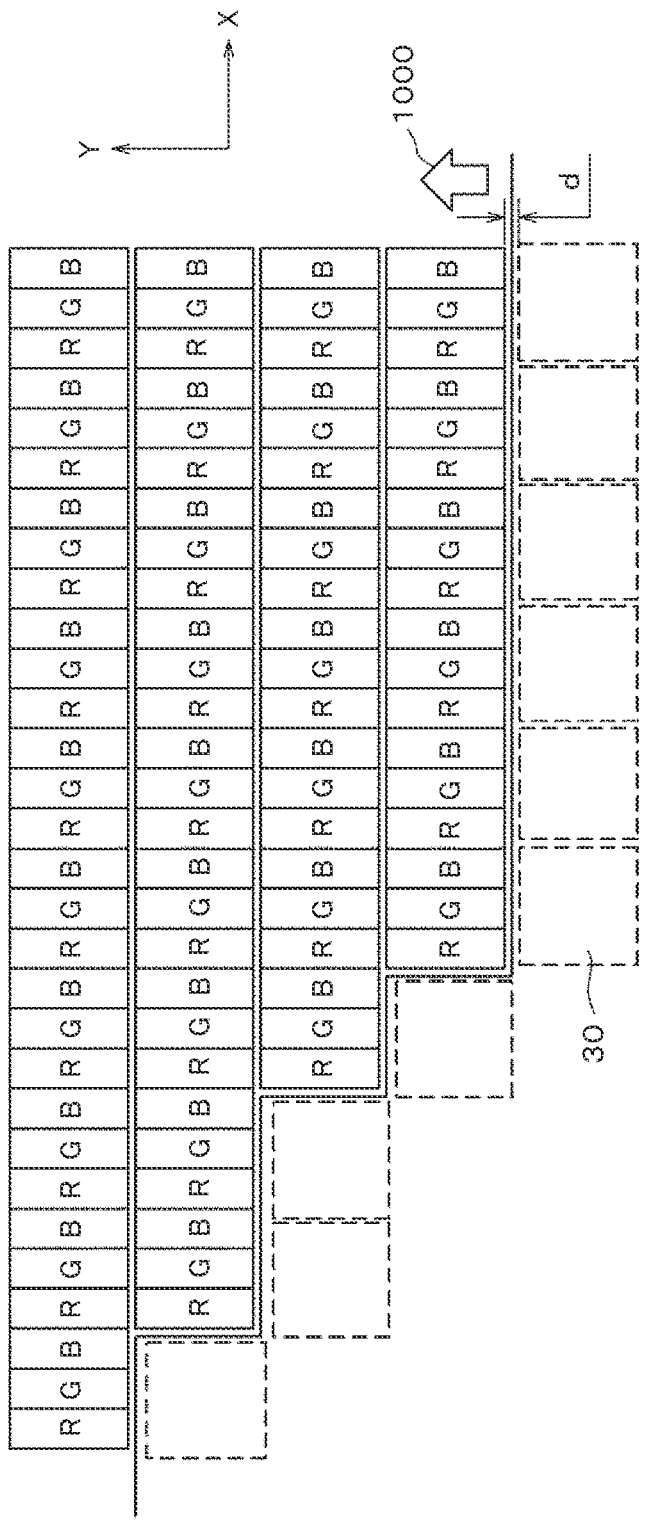
FIG. 4 is a schematic view representing a peripheral part of the display region.

Meanwhile, selector control lines 31 are necessary for controlling the selector 30. FIG. 4 is a plan view representing arrangement of the selectors 30 and the pixels 50 in a region A as shown in FIG. 2. Referring to FIG. 4, sets of three pixels 50 including a red pixel R, a green pixel G, and a blue pixel B are arranged into a step-like formation so that the outer end of the display region 1000 is approximated to the curve. The selectors 30 corresponding to the respective pixel sets are disposed adjacent thereto. Unlike the general case having the common bus wiring formed adjacent to the outer end of the display region 1000 for applying the common voltage to the common electrode on the display region, the present invention is configured to dispose the selectors 30.

Each pixel is connected to the scanning line from the scanning circuit disposed outside in the lateral direction as shown in FIG. 4. In other words, the selector 30 includes the selector TFT, and accordingly, it is necessary to prevent interference between the scanning line and the gate electrode of the selector TFT, that is, the selector control line.

Figure 5:
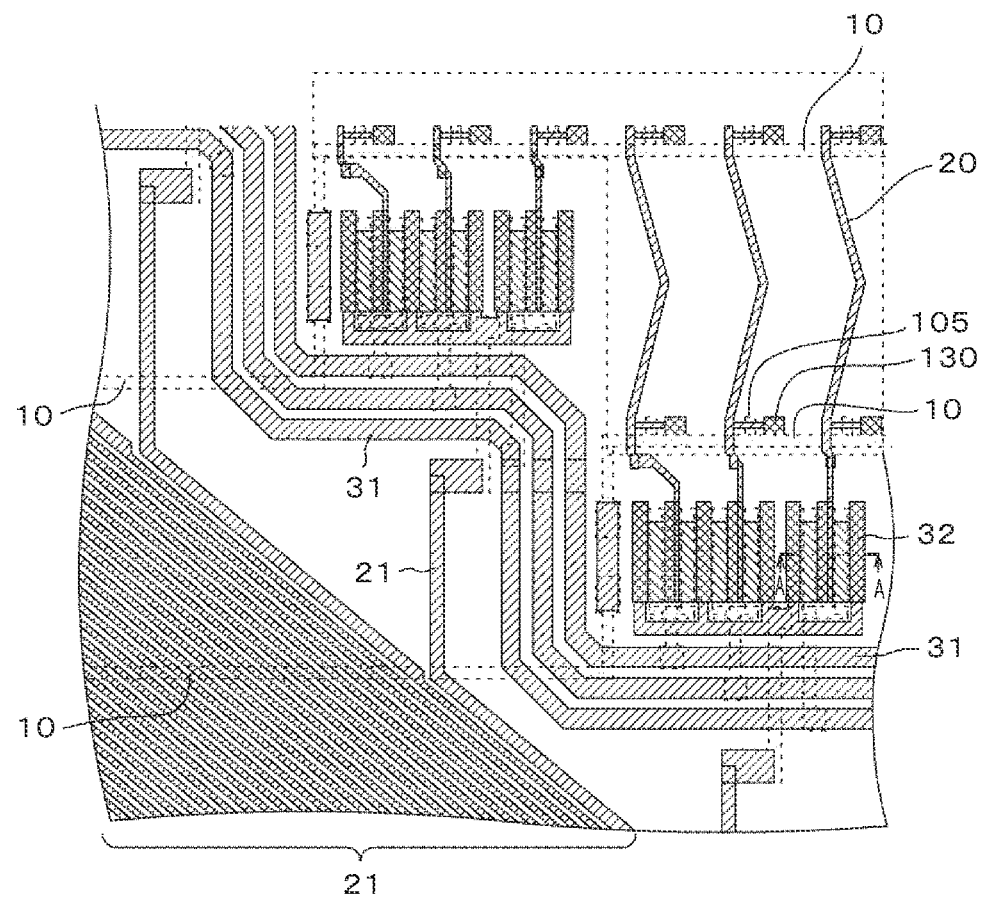
FIG. 5 is a plan view showing a layout of the peripheral part of the display region in the state where the drain lines have been formed.

FIG. 5 is a plan view representing the wiring layout around the end part of the display region in the state where the drain lines 20 have been famed. In the display region as shown in FIG. 5, the longitudinally extending drain lines 20 each of which is bent into the V-like shape are arranged in the lateral direction. The laterally extending scanning lines 10 are arranged in the longitudinal direction. The respective pixels are famed in the regions defined by the drain lines 20 and the scanning lines 10, on which the pixel electrodes are formed. As FIG. 5 shows, the pixel electrode has not been formed yet, and the part at which the drain lines 20 are formed becomes the display region as dotted line indicates.

The selector TFTs 32 are disposed adjacent to the pixel at the outermost periphery for the respective drain lines 20. Three selector control lines 31 extend outside the selector TFTs 32 for sending the gate signal to the respective selector TFTs 32. In order to prevent interference between the scanning line 10 and the selector control line 31, the selector control lines 31 are wired on the same layer on which the drain lines 20 are famed so as to be applied onto the same layer on which the scanning lines 10 are famed via the through hole just before connection with the selector TFTs 32. This makes it possible to dispose the selectors 30 adjacent to the display region in spite of the variant-shape display region.

The video signal is sent to the set of three selector TFTs 32 via the common video signal lead-out line 21. The video signal is divided and allocated to the drain lines 20 by the signal via the selector control line 31. As a result, the number of the video signal lead-out lines 21 is ⅓ of the number of the drain lines 20 as FIG. 5 shows. The present invention is configured to dispose the selector adjacent to the display region so that the video signal lead-out line 21 intersects the scanning line. In the case where the selector is disposed apart from the display region, the number of the crossing points between the video signal lead-out lines and the scanning lines is reduced, which may increase the number of crossing points with the drain lines. The structure according to the present invention ensures reduction in the number of the crossing points between the scanning lines and the drain lines. Furthermore, the selector control line 31 interposed between the video signal lead-out line and the selector allows reduction in the crossing points between the selector control lines and the video signal lead-out lines, while reducing the length of the selector control line. Referring to FIG. 5, the selector control line is disposed along the selector. It is also possible to dispose the selector control line parallel to the video signal lead-out lines. This makes it possible to further reduce the length of the selector control line.

As FIG. 4 shows, the number of pixels in Y-direction corresponding to each selector varies in accordance with the X-direction. For example, in the linear outer shape part of the display region 1000, 320 pixels are covered by the selector 30. In the curved outer shape part of the display region, the minimum of 6 pixels are covered by the selector 30.

In the aforementioned state, each resistance or capacity of the wiring covered by the respective selectors 30 varies, and accordingly, the magnitude or delay of the signal may vary depending on the location. The present invention is configured to change the channel width of the selector TFT 32 in accordance with the location for the purpose of preventing the variance. For example, the channel width of the selector TFT 32 to be disposed on the linear part is made larger than the channel width of the selector TFT 32 to be disposed on the curved part. The channel width of the selector TFT 32 to be disposed on the curved part is also changed in accordance with the location. This makes it possible to generate uniform image in spite of the variant-shape display panel.

FIG. 6 is a plan view showing a state where the pixel electrodes 112 have been famed on the same region as shown in FIG. 5. In other words, FIG. 6 represents that the inorganic passivation film, the organic passivation film, the common electrode, the capacitive insulation film, and the pixel electrode have been laminated to form the layout on the region as shown in FIG. 5. As FIG. 6 shows, the part at which the drain lines 20 are famed becomes the display region as dotted line indicates.

FIG. 6 shows that the common electrode 110 as the transparent electrode is famed over the entire surface except the through hole 130. On the display region, the pixel electrode 112 is formed through the ITO process in the region defined by the drain line 20 and the scanning line 10. A dummy pixel electrode 1121 having the same shape as that of the pixel electrode 112 is formed outside the display region at the same pitch as the pixel electrode 112. This makes it possible to form the pixel electrode 112 at the outermost part of the display region under the same process conditions as those for forming the pixel electrodes 112 in the display region. It is possible to apply the common voltage to the dummy pixel electrode 1121, which will be described later.

Figure 7:
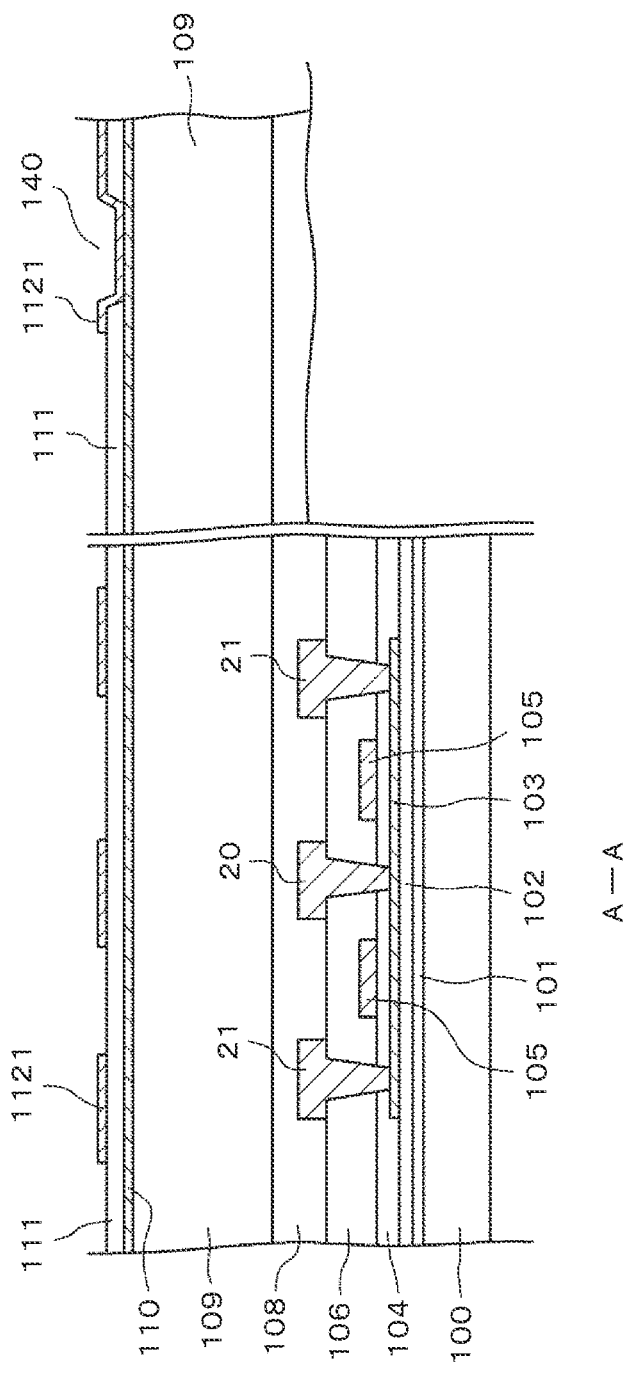
FIG. 7 is a sectional view of a selector part.

FIG. 7 is a sectional view taken along line A-A of FIG. 5, illustrating a cross section of the area around the selector TFT 32. The layer structure is the same as the cross section structure of the display region as described referring to FIG. 1. In other words, the gate insulation film 104 is formed on the semiconductor layer 103, on which the gate electrode 105 is formed. The interlayer insulation film 106 is formed to cover the resultant layer.

The gate electrode 105 is connected to the selector control line 31, and the source electrode corresponds to the video signal line 21. The drain electrode corresponds to the drain line 20. In other words, two source electrodes are famed in parallel with each other to constitute the selector TFT 32. The inorganic passivation film 108 is famed while covering the drain electrode and the source electrode, on which the organic passivation film 109 is famed. The common electrode 110 planarized by the ITO process is famed on the organic passivation film 109.

The capacitive insulation film 111 is famed to cover the common electrode 110, on which the dummy pixel electrodes 1121 are famed. The present invention is configured to allow the common electrode 110 to cover the upper part of the selector TFT 32. The common electrode 110 is formed successively with the common electrode 110 on the display region. The aforementioned structure allows the common electrode 110 to shield the selector 30. The common voltage is applied to the common electrode 110 from the common wiring (common bus wiring) disposed outer than the selector 30.

Generally, the common bus wiring is formed adjacent to the display region. The present invention is configured to form the common bus wiring at the position outer than the selector 30. The structure allows the selector control line 31 to be famed on the same layer on which the drain line 20 or the common bus wiring is famed.

If the dummy pixel electrode 1121 as shown in FIG. 6 is not required to be brought into the floating state, a through hole 140 is famed in the capacitive insulation film 111 as indicated by the right side of FIG. 7 so that the common voltage is applied to the dummy pixel electrode 1121. The through hole 140 may be formed in the capacitive insulation film 111 simultaneously with formation of the through hole 130 in the display region.

As described above, the present invention allows the variant-shape display panel to form the selector adjacent to the display region, which ensures to prevent increase in the area of the frame region of the variant-shape display panel. The selector may be shielded by the common electrode, and the channel width of the selector TFT is varied in accordance with the location, resulting in uniform display screen on the variant-shape display panel.

Figure 8:
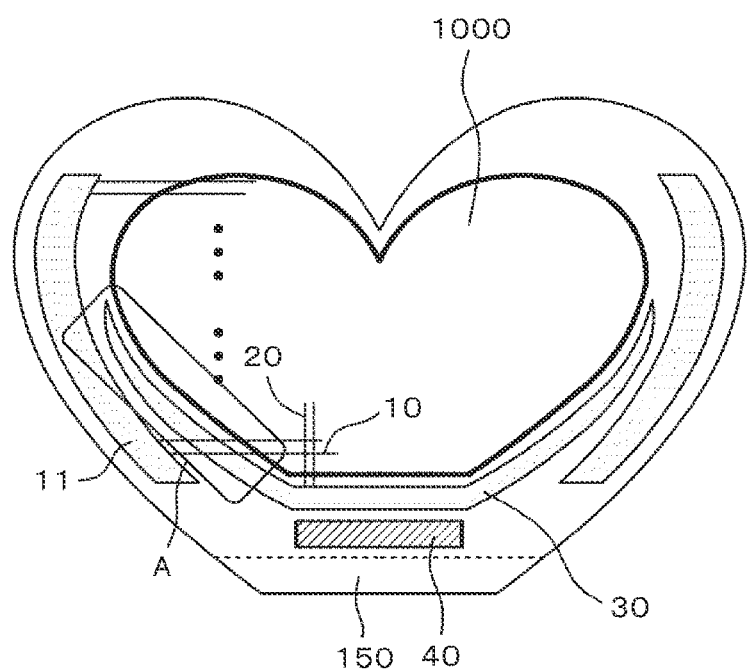
FIG. 8 is a view showing another example of a variant-shape display panel.

The variant-shape display panel with racetrack shape as shown in FIG. 2 has been described. The present invention, however, is applicable to the heart-like variant-shape display panel as shown in FIG. 8. The substantially the same structure as the one described referring to FIG. 2 may be applied to the shape as shown in FIG. 8. That is, the structure which is substantially the same as the region A shown in FIG. 2 may be applied to the region A as shown in FIG. 8. Referring to FIG. 8, however, as the upper part of the display region is not linearly shaped, the capacity of the selector TFT to be disposed below the display region, that is, the channel width has to be changed even at the linear part.

Each of the variant-shape display regions as shown in FIGS. 2 and 8 is formed by combining the linear part and the curved part. However, the present invention is applicable to the display device with the display region formed by combining linear sides into such shape as triangle, pentagon, and hexagon. Referring to FIGS. 2 and 8, the scanning circuits are disposed at both sides of the display screen. However, the present invention is applicable to the structure having the scanning circuits disposed at one side of the display screen. Application of the present invention is not limited to the liquid crystal display device, but to the display device of arbitrary type, such as the organic EL display device, which includes the display region shaped other than a rectangle, and the selector (switching circuit) for time division supplying the video signal to the drain lines (video signal lines) on the display region.

What is claimed is:

1. A display device comprising:
   a substrate having a display region having a non-rectangle outer shape and a peripheral region;
   a first wiring extending in a first direction in the display region,
   a second wiring extending in a second direction crossing the first direction in the display region;
   a transistor disposed at the peripheral region and connected to the second wiring;
   a lead wiring connected to the transistor; and
   a transistor control wiring connected to the transistor, wherein
   the transistor control wiring is disposed along the non-rectangle outer shape of the display region,
   the transistor and the transistor control wiring are disposed between the display region and the lead wiring,
   the first wiring crosses the transistor control wiring and the lead wiring at the peripheral region,
   the first wiring has a portion which extends in the second direction between the display region and the transistor control wiring,
   the transistor control wiring is disposed on a first layer,
   the lead wiring includes a first portion which is disposed on the first layer, and a second portion which crosses the transistor control wiring and is disposed on a second layer which is different from the first layer, and
   the transistor has a gate electrode which is connected to the transistor control wiring, and the gate electrode is disposed on the second layer.

2. The display device according to claim 1, wherein
   the transistor control wiring extends in the first direction and bend to the second direction along the outer shape of the display region.

3. The display device according to claim 1, wherein
   the portion of the first wiring is disposed on the first layer, and
   the first wiring other than the portion of the scanning line is disposed on the second layer.

4. The display device according to claim 1, wherein
   the second wiring is disposed on the first layer.

5. The display device according to claim 1, further comprising an insulation layer disposed between the first layer and the second layer,
   wherein the second layer is disposed between the insulation layer and the substrate.

6. The display device according to claim 1 further comprising: a scanning circuit connected to the first line,
   wherein
   the lead wiring is connected to a driver IC,
   the outer shape of the display region is formed by combining a linear part and a curved part,
   the driver IC is disposed corresponding to the linear part, and
   the scanning circuit is disposed corresponding the curved part.

7. The display device according to claim 1 wherein
   the portion of the first wiring does not cross the transistor control wiring and the lead wiring in a plan view.

8. The display device according to claim 1 wherein
   the portion of the first wiring is disposed between the transistor and the transistor control wiring.

* * * * *